United States Patent [19]

Gilmore et al.

[11] Patent Number: 5,070,458

[45] Date of Patent: Dec. 3, 1991

[54] METHOD OF ANALYZING AND PREDICTING BOTH AIRPLANE AND ENGINE PERFORMANCE CHARACTERISTICS

[75] Inventors: John P. Gilmore; Dereck B. Clark, both of Glendale, Ariz.

[73] Assignee: Honeywell Inc., Minneapolis, Minn.

[21] Appl. No.: 332,648

[22] Filed: Mar. 31, 1989

[51] Int. Cl.$^5$ .................... G06F 7/70; G06F 15/48; G05B 13/04; G05D 1/00
[52] U.S. Cl. .................... 364/424.06; 364/431.01; 364/551.01; 364/149; 364/151; 244/180; 244/194
[58] Field of Search .................. 364/431.01, 431.02, 364/424.06, 442, 550, 551.01, 148-152; 244/180-182, 194, 904

[56] References Cited

U.S. PATENT DOCUMENTS

| | | | |
|---|---|---|---|
| 4,215,412 | 7/1980 | Bernier et al. | 364/551.01 |
| 4,325,123 | 4/1982 | Graham et al. | 244/182 X |
| 4,785,403 | 11/1988 | Kuhlberg | 364/424.06 |
| 4,837,695 | 6/1989 | Baldwin | 364/551.01 X |

Primary Examiner—Parshotam S. Lall
Assistant Examiner—E. J. Pipala
Attorney, Agent, or Firm—A. A. Sapelli; R. Jensen; A. Medved

[57] ABSTRACT

Aircraft/engine performance is determined by the method of the present invention, wherein the performance characteristics are defined by learned performance parameters. The method includes the steps of learning the performance parameters of the aircraft/engine combination, for a given flight, using previously learned performance parameters and current observations. Then, based on the performance parameters learned from the learning step, a prediction is made of the performance of the aircraft/engine combination for subsequent flights.

16 Claims, 6 Drawing Sheets

METHOD OF ANALYZING AND PREDICTING BOTH AIRPLANE AND ENGINE PERFORMANCE CHARACTERISTICS

BACKGROUND OF THE INVENTION

The present invention relates to Flight Management Systems, and more particularly, to a method of determining the performance characteristics of an aircraft/engine based on actual data gathered and saved from each flight.

Present day systems utilize the "rule of thumb" technique in predicting the performance characteristics of the aircraft/engine (s), whereby the pilot, based on previous experience, makes a reasonable estimate of the performance characteristics. Some present day aircraft/engine performance characteristic systems have also been devised which include a custom performance computer for preselected aircraft/engine combinations. These systems utilize "average parameters" for a predetermined model/class of aircraft/engine combination. It is well understood that even within the same model, parameters/characteristics will vary between individual aircraft/engine(s). Clearly, the "average parameters" of the model do not have incorporated therein any features or characteristics unique to an individual aircraft/engine combination.

The disadvantages of these present day systems is that they have inaccuracies associated therewith. The "rule of thumb" method can be very inaccurate since it is difficult to compensate for temperature of the air, weight of the aircraft,.... Also, this method usually adds to the pilot workload at a time when the pilot is already very busy. The custom performance computer does not account for manufacturing tolerances and the wear/degradation of parameters resulting from aging and usage. Further, this system does not adjust to different pilot techniques.

The present invention overcomes the disadvantages of the present day systems. The method of the present invention makes performance predictions for an individual aircraft and engine(s) using parameters which are "learned" from flight to flight. The data, which is used by the method of the present invention for predicting performance characteristics, is initialized with reasonable values of specific performance parameters. The method of the present invention includes the adjustment (updating) of specific performance parameters resulting from each flight. Thus, the performance characteristics of a given aircraft/engine combination are learned from flight to flight for use in future flights of the given aircraft/engine(s). The learned parameter technique of the present invention thereby adjusts to changes in the aircraft/engine due to aging, is tailored to a specific airframe/engine(s) combination, and accounts for manufacturing tolerances.

SUMMARY OF THE INVENTION

Therefore, there is provided by the present invention, a method for determining aircraft and engine performance characteristics. The method of the present invention determines aircraft/engine performance, in which predefined performance parameters define the performance characteristics of the aircraft/engine combination. The method includes the steps of learning the performance parameters of the aircraft/engine combination, for a given flight plan entered by the pilot, using previously learned performance parameters. Then, based on the performance parameters learned from the learning step, a prediction is made of the performance of the aircraft/engine combination for the given flight.

Accordingly, it is an object of the present invention to provide a method for determining aircraft and engine performance.

It is another object of the present invention to provide a method for determining aircraft and engine performance from previously learned parameters.

It is still another object of the present invention to provide a method for determining aircraft and engine performance from previously learned parameters to learn the parameters of the present flight.

It is yet another object of the present invention to provide a method for determining aircraft and engine performance from previously learned parameters, to combine the parameters learned from the present flight with the previously learned parameters, thereby generating the most up-to-date learned parameters.

It is a further object of the present invention to provide a method for determining aircraft and engine performance to predict aircraft performance characteristics.

It is still a further object of the present invention to provide a method for determining aircraft and engine performance to predict aircraft performance characteristics from previously learned parameters.

It is yet a further object of the present invention to provide a method for determining aircraft and engine performance to learn and predict aircraft/engine performance characteristics.

These and other objects of the present invention will become more apparent when taken in conjunction with the following description and attached drawings, wherein like characters indicate like parts, and which drawings form a part of the present invention.

BRIEF DESCRIPTION OF THE DRAWINGS

FIG. 2, which is comprised of FIGS. 2A through 2C, shows a functional flow diagram of a method utilized in the preferred embodiment of the present invention for obtaining parameters utilized in the learning process of the present invention;

DETAILED DESCRIPTION

The method of the preferred embodiment of the present invention can be thought of as comprising two major portions, learning and predicting (of the performance characteristics). The learning portion will now be described, and the prediction portion will be described later.

Figure 1:
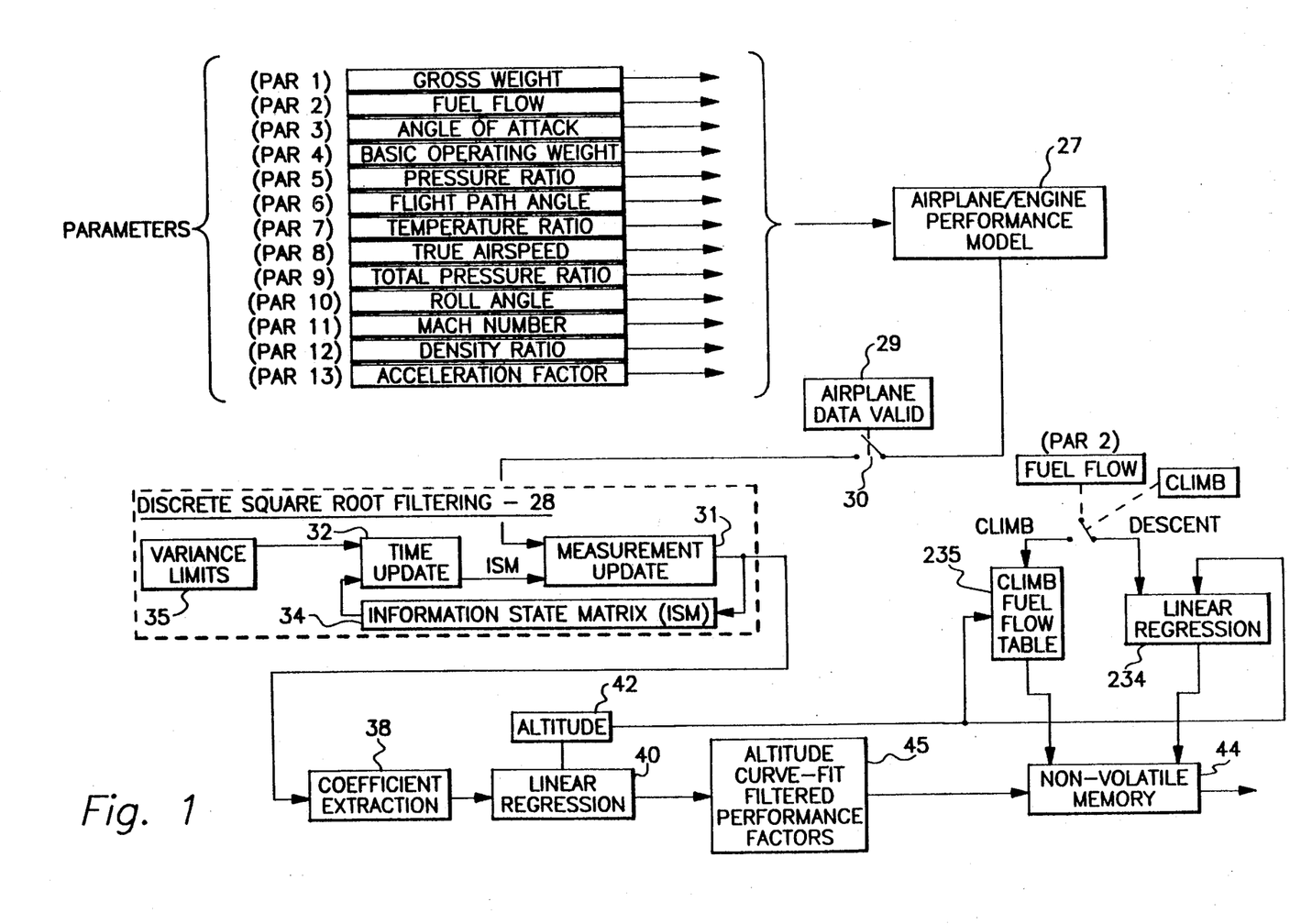
FIG. 1 shows a functional flow diagram of the learning portion of the preferred embodiment of the present invention.

Referring to FIG. 1, there is shown a functional flow diagram of the learning portion of the method of the preferred embodiment of the present invention. Parameters 1 through 13 (PAR1, PAR2,..., PAR 13) are provided to an Airplane/Engine Performance Model 27 (which is sometimes referred to herein as a Thrust/Drag Model 27). The output of the Performance Model 27 is applied to a switch 30. Controlling the switch 30 is the AIRPLANE DATA VALID logic 29, which will be described in further detail hereinunder. If the AIRPLANE DATA VALID logic 29 has all the conditions met, which yields a true output, the switch will be closed, thereby permitting output of the performance model 27 to be incorporated into an information state matrix 34 via a measurement update process 31. Discrete square root filtering measurement update 31 along with the entire discrete square root filtering algorithm 28 is performed (the algorithm, well known in the art, is described in the IEEE Transactions on Automatic Control, Volume AC-16, No. 6, December 1971, pages 731–734, and will not be described further herein). The discrete square root filtering algorithm 28 provides a statistical best curve fit of the measurement update data using the data received from the performance model 27, time update 32 and the variance limits 35. The output of the measurement update 31, which represents the performance factors, is provided to a coefficient extraction algorithm 38. The performance factors (also referred to herein as performance parameters) are combined with the current average aircraft altitude 42 by a linear regression algorithm 40, which provides a method to curve-fit the performance factors to altitude, the output being in terms of a slope m (performance factor/altitude) and an intercept b (performance factor intercept) 45 forming a linear equation $y = mx + b$, where x is the altitude and y is the performance factor. The slopes and intercepts representing the performance factors are saved at the end of the aircraft flight in a non-volatile memory 44 for future flight predictions.

The fuel flow in climb and descent is recorded and filtered (filtered fuel flow, FilteredWf (PAR2)) from flight-to-flight for use in the performance model 27. The learning process climb fuel flow table 235 update occurs unconditionally if the aircraft is 1,000 ft. above takeoff. Once the aircraft reaches 10,000 ft. above takeoff, the learning process must be active for the fuel flow update to occur. This check ensures that the aircraft is being operated in a representative manner. The curve-fitting of descent fuel flow Linear Regression 234 occurs if the learning process is active during the descent. Performance factors 45 are updated with a new observation every ten seconds in the preferred embodiment of the present invention. In the preferred embodiment of the present invention, filtered fuel flow is stored in a fuel flow table 235 during flight. At the end of the flight, the values in the Climb fuel flow table 235 are stored in non-volatile memory 44 for use in making predictions in future flights. The climb fuel flow table 235 in the preferred embodiment of the present invention is divided into 3 segments:

a. below 10,000 ft. MSL - one entry every 500 ft.

b. between 10,000 ft. and 40,000 ft. MSL - one entry every 1,000 ft.

c. between 40,000 ft. and 50,000 ft. MSL - one entry every 2,000 ft. (In the preferred embodiment, when the current altitude 42 is within 50 feet of the Climb Fuel Flow Altitude 235, then the filtered fuel flow is stored in the climb fuel flow table 235 for future flight predictions.) Prior to the filtered fuel flow (PAR 2 being updated in the climb fuel flow table 235, the current climb fuel flow table 235 data is filtered with previous data taken from non-Volatile memory 44. The rate of filtering the new data starts with an allowable 40 percent change of the previous data. If there is no previous data collected, the previous data at initialized state is as follows:

| ALTITUDE | INITIAL CLIMB FUEL FLOW |
|---|---|
| ALTITUDE < = 10,000 FEET | BOW/7 |
| 10,000 < ALTITUDE < 40,000 FEET | BOW/9 |
| ALTITUDE > = 40,000 FEET | BOW/15 |

(BOW = Basic Operating Weight, PAR 4)

The fuel flow change (FlowChg) starts at 0.40 and moves halfway to 0.05 on each flight, with a limit of 5 percent change in the climb fuel flow table 235 for each new recorded data point. This method allows for a rapid convergence of the typical average climb fuel flow, but still allows flexibility of the climb fuel flow table's mean values to move as climb fuel flow changes from flight-to-flight.

In the preferred embodiment, the Descent Fuel Flow is curve fit using a Least Squares Curve fitting Algorithm 234. Prior to the data being curve fit, the AvgWf (Average Filtered Fuel Flow) is filtered with the previous descent fuel flow curve to minimize large changes in the fuel flow curve due to extreme differences in descent throttle settings. In the preferred embodiment, the existing fuel flow value is weighted twelve times as heavily as the new value. If there is no existing value, the new value is used as is.

Average minimum descent fuel flow value is used to determine when to learn during descents. It is collected at 18,000 feet in altitude typical, plus or minus 50 feet. The average minimum descent fuel flow is allowed to decrease 15 percent from flight-to-flight if the current filtered fuel flow dictates this change. The minimum descent fuel flow is allowed to increase 2 percent from flight-to-flight if the current filtered fuel flow dictates this change. This method allows rapid learning of the average minimum descent fuel flow. If the descent learning process is at an initialized state, the average minimum descent fuel flow value will be the basic operating weight (PAR 4) (BOW)/20. During a descent, if the averaged filtered fuel flow (AVgWf) is greater than 1.7* Average Minimum Descent Fuel Flow, then no learning takes place. This prevents learning performance factors when the fuel flow is much higher than normal, which implies the aircraft is not in a normal descent. The minimum descent filtered fuel flow is stored in non-volatile memory 44.

As mentioned previously, at the end of each flight, the information state matrices 34, the slopes and intercepts of the performance factors 45, climb fuel flow table data 235, slopes and intercepts of descent fuel flow, and minimum descent filtered fuel flow are stored in non-volatile memory 44 for use on subsequent flights.

Because the possibility exists that the learned data may not be reasonable due to the filtering technique 28 diverging or other unsuitable data from the performance model 27 that is learned, a method to reset the learning process is employed in the present invention. In the preferred embodiment of the present invention, the learned performance factors are used to calculate drag at predefined conditions. The calculated drag is tested for reasonability of expected typical values for aircraft using the subject invention. Also, engine performance performance factors can be tested for reasonability using typical anticipated overall engine efficiencies. If a reasonability test fails, the information state matrix 34, altitude curve-fit performance factors 45, and climb/descent fuel flow data 234/235 are initialized with acceptable values.

The learning process described above utilizes the aircraft/engine performance model 27 general form for the climb portion of flight and a similar representation for the descent phase of flight. The aircraft/engine Model 27 actually represents a mathematical drag model for the aircraft and mathematical thrust model for the engine. However, drag of an aircraft represents the performance of the aircraft, as thrust of an engine can represent the performance of an engine for a given fuel consumption rate. The general mathematical model for climb and descent of the preferred embodiment of the present invention is as follows:

$$\text{Thrust Term} = \frac{2356 * \text{AvgWf} * \cos(\alpha) * W}{V * 0.83 * \delta_T * \delta * \sqrt{\theta} * R * \text{BOW}}, \text{(lbs)}$$

Where: 2356 derived from: $\frac{J * Hf}{6076}$ $$\text{Induced Drag} = \frac{\text{Lift}^2}{V^2 * \sigma * \delta * R}$$

Where: $\text{Lift} = \frac{W * \cos(\gamma)}{\cos(\phi)}$ $$\text{Parasite Drag} = \frac{V^2 * \sigma}{R * \delta}$$

$$\text{Performance Factor A} \cong Qo * \frac{\text{BOW}}{[(\text{max gross weight} + \text{min gross weight})/2]}$$

$$\text{Performance Factor B} \cong \frac{295.37}{S * PI * e * \text{AspR}}$$

Where: 295.37 derived from $q$ (dynamic pressure) $q(\text{lb/ft}^{**}2) = 0.5 * (\xi) * (V^{**}2)$, using $V$ in nautical miles per hour (knots)

$$\text{Performance Factor C} \cong \frac{Cdo * S}{295.37}$$

$$\gamma = \frac{[A * \text{Thrust Term}] - ([B * \text{Induced Drag}] + [C * \text{Parasite Drag}])}{(W * \text{ACF})/(R * \delta)}$$

Where:
W = Gross weight, (lbs)
ACF = acceleration factor
Cdo = Coefficient of lift
$\delta_T$ = pressure ratio
$\delta$ = total pressure ratio
AvgWf = fuel flow, (lbs/hour)
$\theta$ = temperature ratio
V = true airspeed, (knots)
$\sigma$ = density ratio
$\alpha$ = angle of attack, (degrees)
BOW = Basic Operating Weight, (lbs)
$\phi$ = Roll Angle, (degrees)
= Mass density of air
R = Assumed Variance of Sensor Data (Only used in Learning Phase)
Qo = Overall engine efficiency
J = Joule's Constant, 778 ft lb/BTU
Hf = heat value of fuel, approximately 18,400 BTU/lb
S = Planform Area, (feet squared)
PI = 3.141593 e = Oswald's efficiency factor
AspR = aspect ratio
A,B,C = Performance Factors (Learned Values)

Performance factors A, B, and C are initialized before learning begins. As learning progresses, performance factors A, B, and C change to allow the best curve fit for the particular aircraft/engine(s).

Figure 2A:
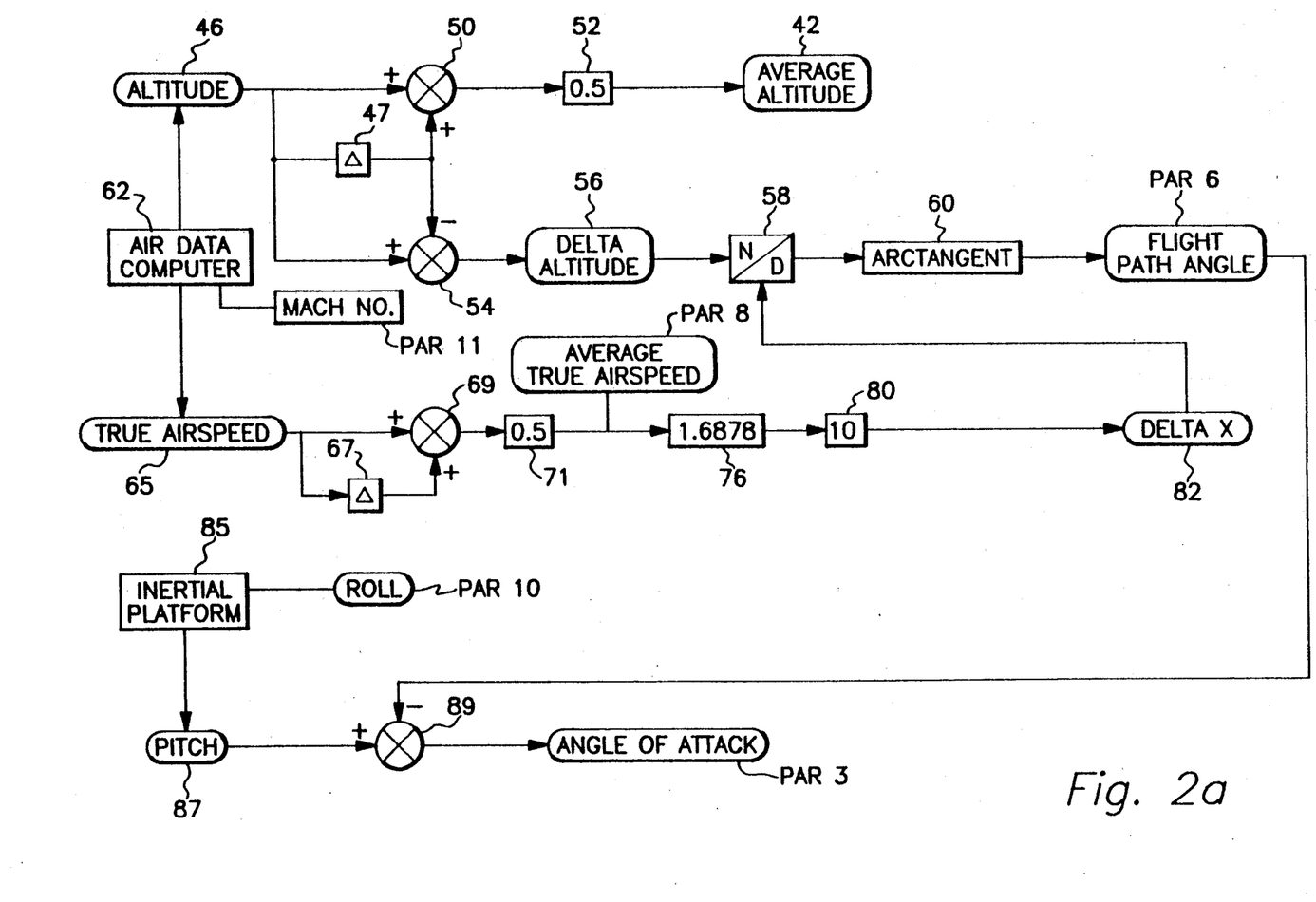
Figure 2B:
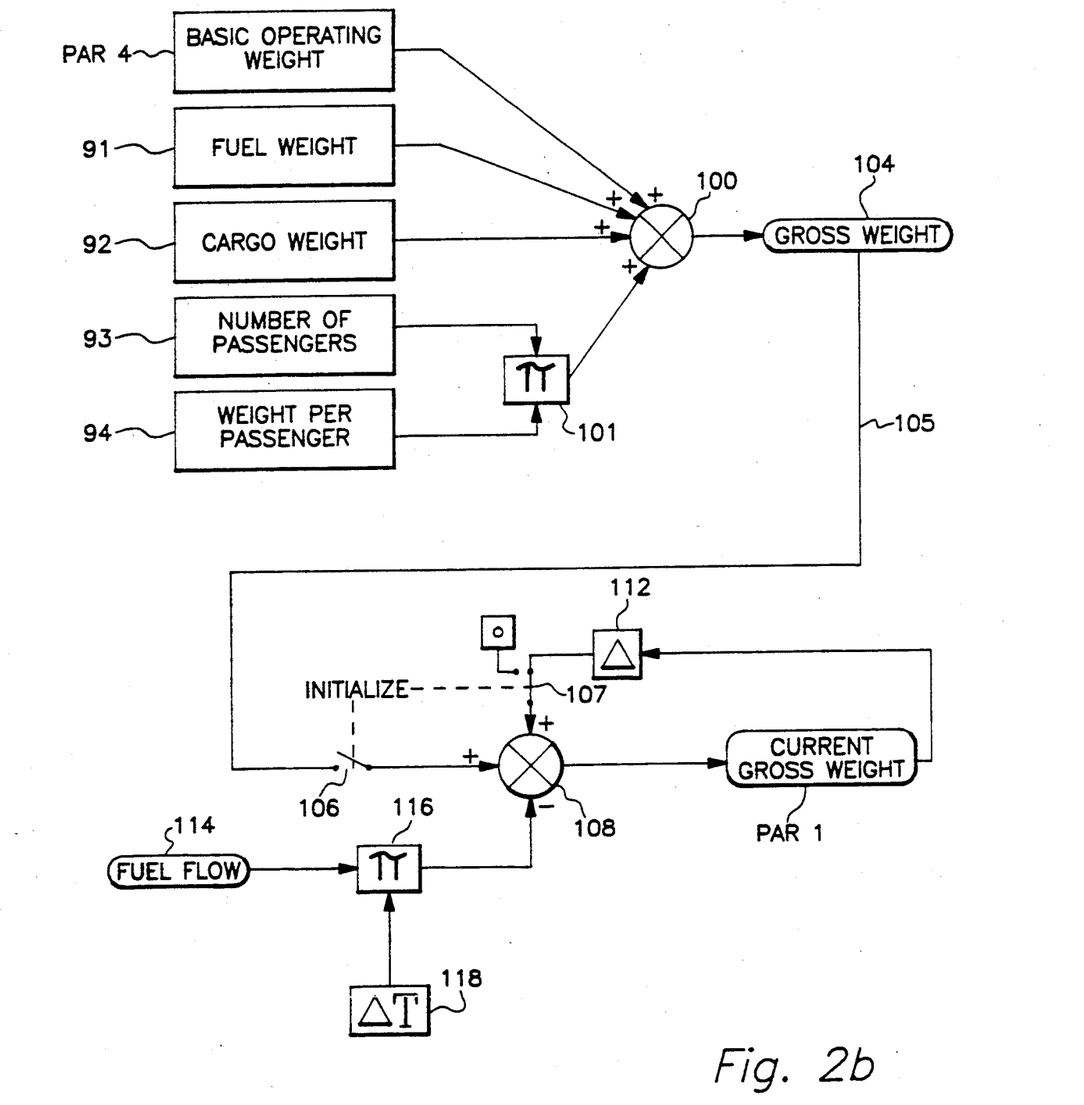
Figure 2C:
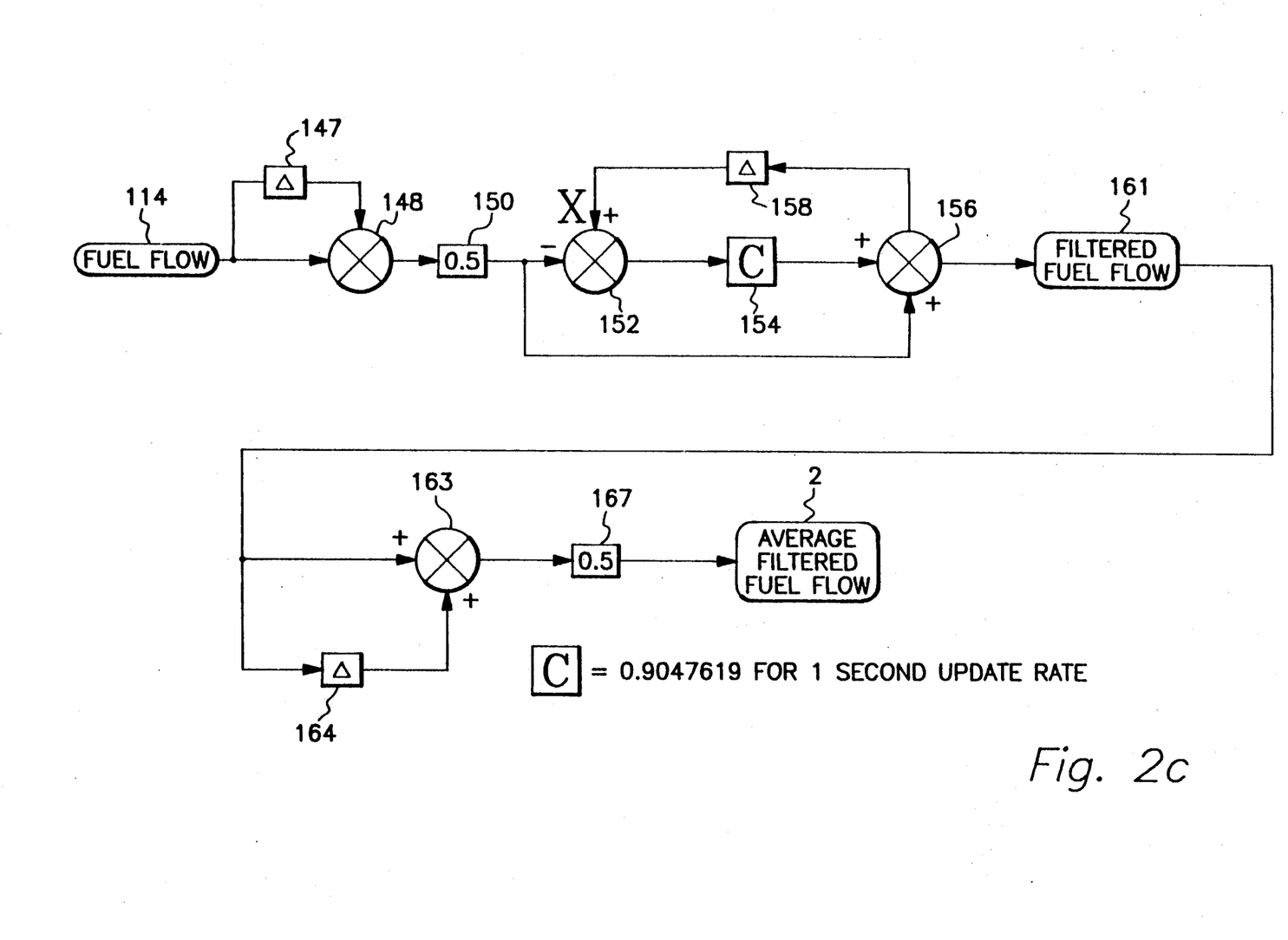

A discussion of the origin of the parameters will now follow making reference to FIGS. 2A through 2C, which together comprise FIG. 2.

Referring to FIG. 2A, an air data computer 62 (or equivalent source for baro-corrected altitude) provides a signal proportional to the baro-corrected altitude (ALTITUDE 46). The altitude 46 signal is coupled to a conventional summer (adder) 50 which sums the current altitude with the altitude at the beginning of a sampling period. The altitude 46 is also coupled to a subtracting device 54, and a delay block 47, the output of the delay block being coupled to the summer 50 and the subtracting device 54. The output of the summer 50 is the sum of the last two altitude signals collected from ALTITUDE 46. The sum is multiplied 52 by the value (0.5), thereby providing a signal proportional to the average altitude (AVERAGE ALTITUDE 42) over the sampling period. The output of the subtracting device 54 is the difference of the last two altitude signals, yielding the delta altitude 56.

Flight Path Angle, PAR 6, can be calculated by taking the inverse tangent of the change in altitude, Delta Altitude 56 divided by the change in distance Delta×82. Conventional air data computer 62 applies a signal proportional to true airspeed 65 to conventional summing junction 69. The same signal 65 is coupled to a delay block 67. These signals represent the True Airspeed at the beginning and end of the sampling period. Conventional summing junction 69 then forms the algebraic sum of the signals representing current and previous True Airspeeds, which is then coupled to a conventional gain block 71. Gain block 71 multiplies the impressed signal by 0.5 (sometimes referred to herein as constant averaging multiplier). The output of gain block 71 (PAR 8) is a signal proportional to the Average True Airspeed (PAR 8) over the sampling period. The True Airspeed signal, in units of knots, is then coupled to gain block 76. The output of gain block 76 is the True Airspeed in units of feet per second, and is coupled to a gain block 80. The output of Gain block 80, multiplies the impressed signal by 10 seconds (the sampling interval), giving a signal proportional to the distance traveled through the air during the sampling interval. This signal is then impressed on divider 58 to generate a signal proportional to the tangent of the Flight Path Angle. Arctangent block 60 then generates a signal proportional to airmass-referenced Flight Path Angle, PAR 6.

The Pitch 87 is obtained from a conventional Inertial Platform 85. The pitch angle signal 87 is applied to a summing device 89, which subtracts the flight path angle from the pitch angle to obtain a value of the Angle of Attack, PAR 3.

Referring to FIG. 2B, the current gross weight is calculated by applying to a conventional summer 100, signals proportional to the BASIC OPERATING WEIGHT PAR 4, FUEL WEIGHT 91, and CARGO WEIGHT 92 simultaneously. The Number of Passengers 93 is multiplied by the Per Passenger Weight 94 in multiplier 101 to obtain the total passenger weight to be impressed upon summer 100. The output of the summation 100 is termed the Initial Gross weight 104. The Initial Gross Weight 104 is coupled to a switch 106. When the system of the present invention is initialized, the switch 106 is closed thereby coupling the initial gross weight signal 104 to a summing device 108. A value of the metered fuel flow 114 is coupled to a block multiplier 116, the block multiplier also receiving a time increment from a timing source 118 the time over which the fuel flow is to be integrated. The output of the block multiplier 116 is proportional to fuel consumed since the last sample, and is coupled to the summing device 108. The output of the summing device 108 is the Current Gross Weight, PAR 1. The Current Gross weight is coupled back to the summing device 108 through a delay block 112, which serves as a memory device for repetitive computations of Current Gross Weight. Switch 107 is controlled by the initialization signal such that the input to summing device 108 from the delay block 112 is set to a zero value on initialization.

Mach number, PAR 11, is obtained from the air data computer 62, and Roll, PAR 10, is obtained directly from the inertial platform 85.

The derivation of the filtered average fuel flow (PAR 2) will now be described. Referring to FIG. 2C, the metered fuel flow 114 is coupled to a summing device 148 and to a delay 147, the output of the summing device 148 being coupled to a constant averaging multiplier 150. The output of the multiplier 150 is subtracted by a conventional summing device 152 from the signal at point X. The output of conventional summing device 152 is coupled to a multiplier 154 (using a constant value C, an exponential decay time constant), whose output is in turn coupled to summing device 156. The output of multiplier 150 is also coupled to summing device 156. The output of summing device 156 is coupled back to point X through delay 158. The output of summing device 156 is a Filtered Fuel Flow 161, the operation on the fuel flow 114 providing a lag filter to smooth out spikes in the raw sensed fuel flow 114. The filtered fuel flow 161 is coupled to a delay 164, generating a delayed filtered fuel flow signal, and is added to the filtered fuel flow signal via summing device 163. The output of the summing device 163 is multiplied by 0.5 in multiplier 167, the result being the Average Filtered Fuel Flow (PAR 2).

The Temperature Ratio, PAR 7, is the ratio of current temperature to the temperature at Sea Level on a Standard Day (15 degree Celsius). Below are the equations used to predict the temperature at a given Altitude 42:

GIVEN: TEMP OFFSET = (CURRENT TEMP −

STD DAY TEMP @ CURR ALT)

IF ALTITUDE > 36,089 FEET

THEN TEMPERATURE (ALT > 36,089 FEET) =

329.5 degrees K.

ELSE TEMPERATURE (ALT < = 36,089 FEET) =

288 * (DEG KELVIN) * − (ALT * 0.001983)

THEREFORE, TEMPERATURE RATIO 7 (theta) AS A

FUNCTION OF ALTITUDE IS $$\text{theta (ALT)} = \frac{\text{(TEMPERATURE + TEMP OFFSET)}}{(288)}$$

The Pressure Ratio, PAR 5, (delta) is the ratio of current pressure of air at a given altitude (42) to the pressure of air at sea level for a Standard Day.

$$\text{delta (alt)} = \frac{P}{P_o} = \frac{\text{pressure of air at alt}}{\text{pressure of air at sea level on Std Day}}$$

The Pressure Ratio PAR 5 is calculated as a function of altitude in the following manner using ALTITUDE 42 and Temperature Ratio 7 (theta):

| IF ALTITUDE < 36,089 | | |
|---|---|---|
| | | 5.2561 |
| delta (alt) = theta (alt) | | |
| ELSE expon = ((ALT − 36,089)/20806)) | | |
| | | 5.2561   expon |
| delta (alt) = 0.2234*theta(alt) | | *2.718 |

The Total Pressure Ratio, PAR 9, is obtained using the following equations that use Altitude 42 and Mach Number (PAR 11).

$$\text{delta total(alt)} = \text{delta(alt)} * \left[\left(1 + \frac{\text{chi} - 1}{2} * M^{**}2\right)\right]^{\left(\frac{\text{chi}}{\text{chi} - 1}\right)}$$

where:
  delta = Pressure Ratio, PAR 5, for an altitude 42
  M = MACH ratio for an altitude 42
  chi = ratio of specific heat, 1.4 for air The Density Ratio (PAR 12) is the density of air to the density of air at Sea Level on a Standard Day. The equations below are used to calculate the Density Ratio, PAR 12, by using Altitude 42 and Temperature Ratio (PAR 7):

| IF ALTITUDE < 36,089 FEET | |
|---|---|
| | (4.256) |
| THEN DENSITY RATIO (ALT) = Temperature Ratio (ALT)*e | |
| ELSE expon = − ((ALT − 36,089)/20806)) | |
| | (expon) |
| DENSITY RATIO (ALT) = (0.2971)*2.718 | |

Where:
  ALTITUDE, ALT = Altitude 42
  Temperature Ratio (PAR 7)

The values of the Acceleration Factor, PAR 13, ACF, for the standard atmosphere are as follows using Altitude 42: (In the following equations "Constant CAS" refers to the aircraft being commanded to fly at a Constant Calibrated Airspeed. The airplane's elevator is adjusted via an autopilot system to maintain a Constant Calibrated Airspeed (providing sufficient thrust is available). Similarly, Constant MACH in the following equations refers to the airplane being flown at a Constant Mach Number by means of an autopilot controlling the airplane's elevator (typically).

| IF FLYING AT CONSTANT CAS: | |
|---|---|
| ABOVE 36,089 FT. | ACF = 1.0 + (0.7 $M^2$) |
| BELOW 36,089 FT. | ACF = 1.0 + (0.567 $M^2$) |
| IF FLYING AT CONSTANT MACH | |

| | |
|---|---|
| ABOVE 36,089 FT. | ACF = 1.0 |
| BELOW 36,089 FT. | ACF = 1.0 − (0.133 M²) |

Where:
 M = Mach Number (PAR 11)
 Altitude = Current Airplane Altitude 42

Before the learning process can start, predetermined stability criteria must be met. Specifically referring back to FIG. 1, switch 30 must be closed before the learning process can begin. Therefore, the controlling signal, Airplane Data Valid 29, must be true.

Figure 3:
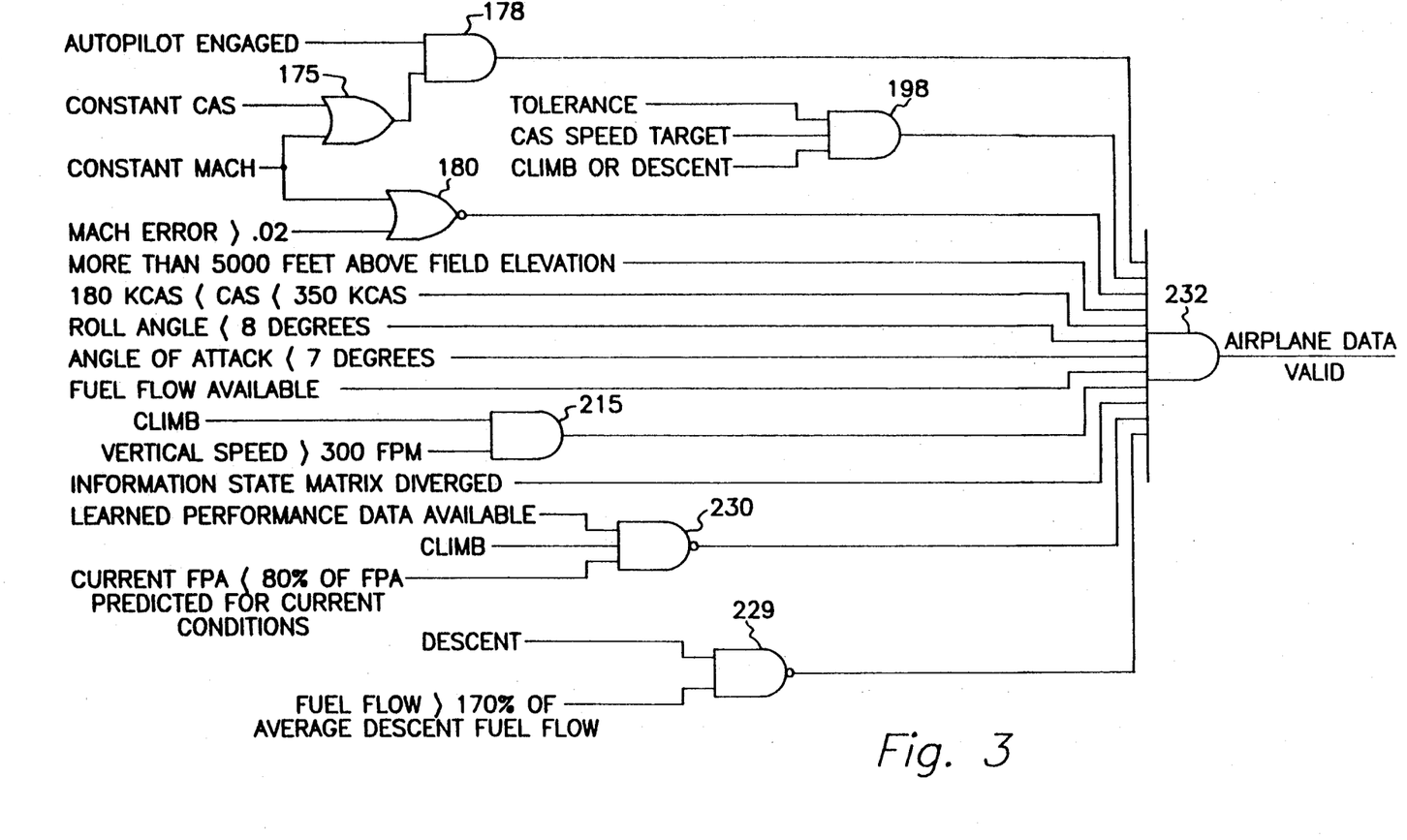
FIG. 3 shows a logic diagram of the conditions required to enable the learning process of the preferred embodiment of the present invention.

Referring to FIG. 3, the criteria utilized in the preferred embodiment of the present invention will now be discussed. The autopilot must be engaged and controlling to either a constant CAS or constant MACH 175,178. If controlling to a constant MACH, the MACH error must be less than 0.02 M.

If controlling CAS in a climb, the tolerance input to AND-gate 198 is true if the CAS error is less than 7KCAS below 10,000 feet AGL (above ground level), or the CAS error must be less than 3.5 KCAS above 10,000 feet AGL. In descent, the CAS error must be less than 3.5 KCAS independent of altitude (if controlling to CAS). If the current speed target is calibrated airspeed, then the second input to AND-gate 198 is true. If the airplane is in a climb or descent, then the third input to AND-gate 198 is true. The altitude must be more than 5,000 feet above field elevation. CAS must be in the range of 180 KCAS to 350 KCAS. The roll angle must be measured less than eight degrees, the angle of attack must be less than seven degrees, and the fuel flow must be known, ie., available. The vertical speed in a climb must exceed 300 FPM, obtained by the output of AND-gate 215. The Information State Matrix describing the current phase of the flight must not have diverged. If learned data is available (ie., data from the previous flight is stored in non-volatile memory 44), the current flight path angle (FPA), PAR 6, must be at least 80% of the FPA expected for the current conditions (calculated by the performance model 27), AND-gate 230. In descent the current fuel flow (PAR 2) must be less that 170% of the average minimum descent fuel flow, AND-gate 229. The signals representing these conditions are coupled to an AND-gate 232, the output being the Airplane Data Valid signal.

The processing of the learning process is done by a type of Kalman filtering routine. The conventional approach to filtering involves propagation of a state estimate and an error covariance matrix from stage to stage. Alternate relationships have been developed to propagate a state estimate and square root error covariance instead. Although algebraically equivalent to the conventional approach, the square root filters provide improved numerical characteristics. The Discrete Square Root Filtering 28 algorithm that is used in the present invention is based on an Institute of Electrical and Electronics Engineers (IEEE) transaction: IEEE TRANSACTIONS ON AUTOMATIC CONTROL, VOL. AC-16, NO. 6, December 1971; article "DISCRETE SQUARE ROOT FILTERING: A SURVEY OF CURRENT TECHNIQUES" by Paul G. Kaminski, Arthur E. Bryson, jr., and Stanley F. Schmidt. The airplane/engine model 27 is applied to the Discrete Square Root Filter 28.

The use of the Discrete Root Filter is basically accomplished in three (3) steps as follows:
 1. Sample Performance Data (from performance model 27);
 2. Perform Time Update of Information State Matrix 32;
 3. Perform Measurement Update of Information State Matrix 31.

The measurement update matrix consists of measurement terms and information state terms combined to form the measurement update matrix 31. In the preferred embodiment, there are two matrices (collection of data) for climb, one below 22,000 feet and one equal/above=22,000 feet, and two matrices for descent, one for Constant-Mach Descent and one for Constant-CAS descent. For climb and descent, the measurement update matrix is:

$$\begin{bmatrix} \frac{1}{\sigma A} & 0 & 0 & \frac{A}{\sigma A} \\ 0 & \frac{1}{\sigma B} & 0 & \frac{B}{\sigma B} \\ 0 & 0 & \frac{1}{\sigma C} & \frac{C}{\sigma C} \\ \frac{2356 * A_{vg}FF * COS(\alpha) * W}{R * 0.83 * \delta * \delta_T * \sqrt{\theta} * V * BOW} & \frac{W^2 * COSL2(\gamma)}{R * V^2 * \sigma * COS^2(\phi) \cdot \delta} & \frac{V^2 * \sigma}{R * \delta} & \frac{\gamma * ACF * W}{R * \delta} \end{bmatrix}$$

NOTE
ROW 4 of the above matrix is the Drag/Thrust model 27.
A, B, and C represent the Performance Factor A, Performance Factor B, and Performance Factor C, respectively.

Where:
 $\delta_T$ = total pressure ratio(9)
 $\delta$ = pressure ratio(5)
 R = measurement noise = 1.0052 (assumed 0.30 degree error in sensor input data, 0.0052 radians = 0.30 degree)
 FF = average current filtered fuel flow(2)
 V = true airspeed(8)
 W = weight(1)
 $\gamma 0$ = flight path angle(6)
 ACF = acceleration factor(13)
 $\theta$ = temperature ratio(7)
 $\sigma$ = density ratio(12)
 $\alpha$ = angle of attack(3)
 BOW = basic operating weight(4)
 $\phi$ = roll angle(10)
(The numbers in the parenthesis are the parameter numbers, PAR x)

If no data is available from pervious flights or an "end of flight" reasonability test fails resulting in re-initializing the learning process, then, the approximate initial values for Performance Factor A, Performance Factor B, and Performance Factor C can be determined by calculating the average Performance Factor A, Performance Factor B, and Performance Factor C for all the anticipated aircraft in which the present invention is to be installed:

$$A = \text{A factor} = \frac{295.37}{S * PI * e * A} \quad (25)$$

$$B = \text{B factor} = \frac{Cdp * S}{295.37} \quad (26)$$

$$C = \text{C factor} = Qo * \frac{BOW}{[(\text{max gross weight} + \text{min gross weight})/2]} \quad (27)$$

Where:
S = planform area
PI = 3.1415927
e = Oswald's efficiency factor
A = aspect ratio
Qo = overall efficiency of engine(s)
BOW = Basic Operating Weight
Gross Weight = total weight of the aircraft The values for Planform Area, Oswald's efficiency factor, Aspect Ratio, BOW, max/min gross weight, and Overall efficiency of engine can be obtained from Airframe/Engine manufacturers. The value of PI can be obtained from math books. The value of Joule's constant can be obtained from conventional Physics books. The value of the heat value of fuel can be found in typical aircraft engine design books.

The approximate sigma value of Performance Factor A, Performance Factor B, and Performance Factor C can be found by determining the Standard Deviation of Performance Factor A, Performance Factor B, and Performance Factor C. The proper selection of Performance Factor A, Performance Factor B, Performance Factor C, the sigma value of Performance Factor A, Performance Factor B, and Performance Factor C can optimize quickness of convergence and at the same time minimize divergence of the Discrete Square Root Filter.

QA, QB, QC are the variances limits 35, or standard deviation squared, of the Performance Factors. The Time Update 32 propagates the measurement matrix 31 through to the information state matrix 34. The time update basically adjusts the mean and standard deviation (variance) of the Performance Factors by weighting the current calculated Performance Factor A, Performance Factor B, and Performance Factor C based on previously observed Performance Factor A, Performance Factor B, and Performance Factor C values.

The performance measurement update 31 updates the terms in the Information State matrix 34. Using the Mean Performance Factors (A, B, and C), Variance Performance Factors (A, B, and C), and current measured data from model 27 (ie. FPA 6, TAS 8, density ratio 12, temperature ratio 7, weight 1, items 1 thru 13), the Measurement Update Matrix 31 is adjusted to make the best prediction of the Performance Factors A, B, and C. The Measurement Update Matrix 31 is then ready to extract the Performance Factors A, B, and C using a Gaussian Reduction/Back Substitution Algorithm (Coefficient Extraction) 38.

After the Discrete Square Root Filtering 28 technique updates the Measurement Update Matrix 31, the optimally adjusted Performance Factors (A, B, and C) are extracted using a Gaussian Reduction/Back Substitution Routine (Coefficient Extraction) 38.

The performance factors vary with altitude in approximately a linear manner. In order to make the learned performance factors more stable and usable in the prediction process, the preferred embodiment performs a linear regression using the method of least squares to fit performance factors to altitude as defined herein.

Detailed equations used to collect the performance factors (A, B, C, and descent fuel flow data), ie., output of coefficient extraction 38, is as follows:

```
AXY  = (A*ALTave)
AY   = A
BXY  = (B*ALTave)
BY   = B
CXY  = (C*ALTave)
CY   = C
FXY  = (F*ALTave)
FY   = F
XAB  = ALTave
X2AB = ALT ave
ASLP = (AXY - XAB*AY/N) / (X2AB - XAB /N)
AINT = (AY - ASLP*XAB)/N
BSLP = (BSY - XAB*BY/N) / (X2AB - XAB /N)
BINT = (BY - BSLP*XAB)/N
CSLP = (CXY - XAB*CY/N) / (X2AB - XAB /N)
CINT = (CY - CSLP*XAB)/N
FSLP = (FXY - XAB*FY/N) / (X2AB - XAB /N)
FINT = (FY - FSLP*XAB)/N
```

Where:
ALTave = average altitude 42
N = number of samples (initialize to zero at beginning of each flight)
AINT = Performance Factor A intercept
ASLP = Performance Factor A slope
BINT = Performance Factor B intercept
BSLP = Performance Factor B slope
CINT = Performance Factor C intercept
CSLP = Performance Factor C slope
FINT = Descent Fuel Flow intercept
FSLP = Descent Fuel Flow slope The result of the Least Squares Algorithm 40 will be slopes and intercepts of the Performance Factors curve-fit to altitude 45.

Figure 4:
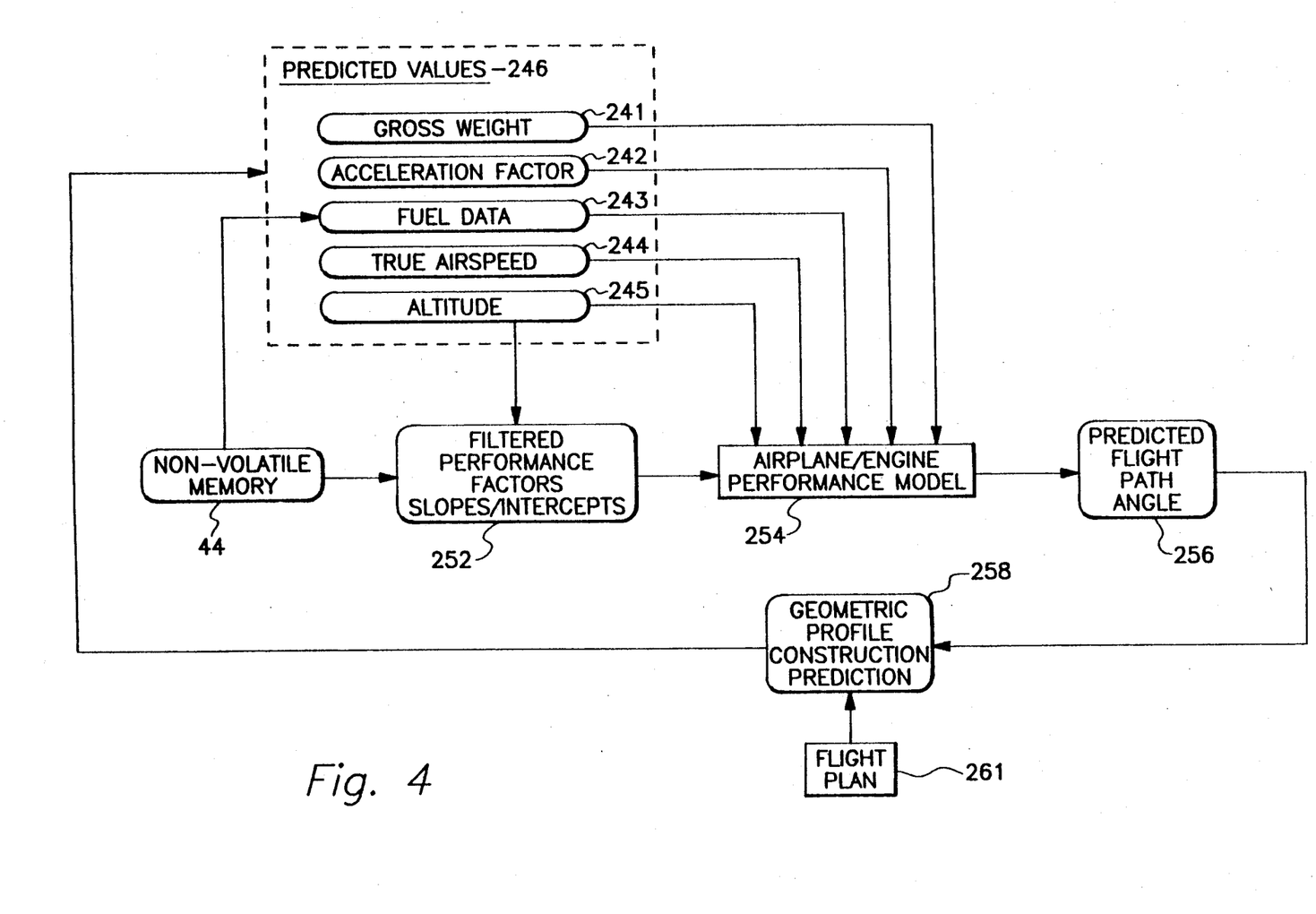
FIG. 4 shows a functional flow diagram of the prediction process of the preferred embodiment of the present invention.

The prediction portion of the preferred embodiment of the present invention will now be described. Referring to FIG. 4, there is shown a functional flow diagram of the prediction process utilized in the preferred embodiment of the present invention. The prediction process uses an Airplane/Engine Model 254 to calculate predicted flight path angle 256 by means of learned performance factors and general predictable atmospheric ratios. The predicted flight path angle 256 is used in conjunction with the pilot entered flight plan 261 to predict the performance (Vertical Speeds, Predicted Altitudes, Top-of-Climb, Top-of-Descent, etc.) of the airplane/engine. The learned performance factors 252, in the form of linear slopes and intercepts obtained from non-volatile memory 44, are inputs to the aircraft/engine performance model 254. Also, predicted values 246, including predicted gross weight 241, acceleration factor 242, TAS 244, altitude 245, and fuel data 243 are inputs to the performance model 254. The predicted flight path angle 256 is applied to a geometric profile construction prediction 258 algorithm, and in conjunction with the inputted flight plan 261, generates a vertical profile prediction of the flight. Predetermined output parameters of the geometric profile construction 258 (ie., predetermined predicted values 246) are coupled back to the performance model 254, thereby utilizing an iterative approach.

In the preferred embodiment of the present invention, the altitude change to be accomplished is divided in up to four altitude bands. The altitude bands are defined to provide relatively constant flight path angles for each of the defined sections. It will be understood by those skilled in the art that high resolution altitude segment bands can be utilized. In the preferred embodiment of the present invention, the segmentation of the altitude bands is as follows:

a. Origin Airport Elevation or current aircraft elevation to the lesser of 9,000 feet or the Speed Restriction Altitude (in U.S., 10,000 feet).

b. From the altitude given in (a) above to the lesser of 22,000 feet or the CAS/Mach transition altitude.

c. From the altitude given above (b) to the CAS/Mach transition altitude (if 22,000 feet used in (b) above) or from the CAS/Mach transition altitude to the tropopause altitude (36,089 feet).

d. From the altitude given above (c) to the tropopause altitude (if CAS/Mach transition altitude used in (c) above) or from the tropopause to the cruise altitude (above the tropopause).

e. From the tropopause to the cruise altitude (above the tropopause).

The "midpoint altitude" of the altitude segments described in the previous section is used to predict atmospheric parameters to be used in the aircraft/engine model prediction. Also, the "midpoint altitude" is used to predict fuel flow, weight, performance factors (learned from previous flights). The following is a list of the parameters calculated using the "midpoint altitude" for the first pass of the prediction loop process:

a. Temperature Ratio—is the ratio of current temperature to the temperature at sea level on a standard day (15 degree Celsius).

b. pressure ratio—is the ratio of pressure of air at altitude (245) to the pressure of air at sea level for a standard day.

$$\text{delta total(alt)} = \text{delta(alt)} * \left[\left(1 + \frac{chi - 1}{2} * M^{**}2\right)\right] - \left(\frac{chi}{chi - 1}\right)$$

Where:
delta = pressure ratio for altitude
M = MACH ratio for an altitude
chi = ratio of specific heat, 1.4 for air
Where:
ALT = Altitude 245 d. density ratio—is the density of air at altitude (245) to the density of air at sea level on a standard day.

True Airspeed (TAS) is used to make prediction of the aircraft/engine model 254. The true airspeed 244 is calculated by observing the speed schedule (pilot entered parameter 261) in CAS/Mach. If the "midpoint altitude" is below the CAS/Mach transition altitude (explained below), then the CAS value is used to calculated the TAS. The Mach value is used if the "midpoint altitude" is above the CAS/Mach transition altitude. The transition altitude is the altitude where the CAS speed (in terms of TAS) becomes less than the Mach ratio (in terms of TAS) for a given CAS/Mach combination. The equations used to predict the TAS at a given altitude are as follows:

IF ALTITUDE < CAS/Mach TRANSITION ALTITUDE
THEN $TAS(ALT) = \frac{CAS}{SQRT(DENSITY\ RATIO)}$
ELSE $TAS(ALT)$ = MACH * SPEED OF SOUND(ALT)
WHERE:
SPEED OF SOUND(ALT) feet per second = 49 * SQRT (TEMPERATURE IN DEGREES, RANKINE)

Where:
ALT = Altitude 245

Below 10,000 ft. MSL, the conventional wind gradient (WG) is calculated as zero if there is no entered cruise wind data. If there is cruise wind data, the wind gradient is calculated as the cruise wind velocity divided by the pilot entered cruise altitude. Above 10,000 ft., the sensed winds (provided by a conventional Inertial Reference System or equivalent) is blended with the existing wind gradient in the following manner:

$$WG = WG + k(MWG - WG)$$
$$k = \frac{(a + 0.5 * b * DX)(Hm + 0.2)}{(Hm + 0.2)^{**}2 + a + 0.5 * b * DX}$$

Where:
DX = distance increment since the last point
a = fine tuning constant = 1.0
b = fine tuning constant = 1.0
Hm = pressure altitude in nautical miles
WG = existing Wind Gradient
MWG = instantaneous measured Wind Gradient.

The predicted Gross Weight of the aircraft is calculated by using the predicted ground speed to determine the duration of burning fuel at a certain rate. Knowing the initial gross weight of the aircraft, the rate at which the fuel is being burned, and the time the fuel is burned allows predicting the gross weight of the aircraft at some future time. The predicted Roll Angle is assumed to be zero for predictions, due to the very small error in overall performance predictions. The angle of attack is usually less than 7 degrees; therefore, the predicted angle of attack is considered three degrees as an acceptable average with minimal contribution to error in the Prediction Process.

The value of the Performance Factors for a given altitude 245 is determined by using the slopes and intercepts of the Performance Factors saved from previous flights in Non-Volatile Memory 44 in the following manner:

Perf Factor A (ALT) = Aslope*ALTITUDE + Aintercept
Perf Factor B (ALT) = Bslope*ALTITUDE + Bintercept
Perf Factor C (ALT) = Cslope*ALTITUDE + Cintercept The predicted Fuel Flow 243 as a function of altitude 245 for climb is determined by interpolating the value of fuel flow for a given altitude 245 using the climb fuel flow tables 235. The climb fuel flow table 235 is learned data from previous flights stored in Non-Volatile Memory 44. The descent fuel flow value for a given altitude 245 is determined by using the descent fuel flow slopes and intercepts 234 recorded from previous flights and stored in Non-Volatile Memory 44. The predicted Flight Path Angle for a particular altitude segment is calculated using the following equation:

$$\text{Thrust Term} = \frac{2356 * \text{AvgWf} * \cos(\alpha) * W}{V * 0.83 * \delta * \delta_T * \sqrt{\theta} * BOW}, \text{ (lbs)}$$

Where: 2356 derived from: $\frac{J * Hf}{6076}$ $$\text{Induced Drag} = \frac{\text{Lift}^2}{V^2 * \sigma * \delta}$$

Where: $\text{Lift} = \frac{W * \cos(\gamma)}{\cos(\phi)}$,

A = Perf Factor A
B = Perf Factor B
C = Perf Factor C $$\gamma = \frac{[A * \text{Thrust Term}] - ([B * \text{Induced Drag}] + [C * \text{Parasite Drag}])}{(W * ACF)/(\delta)}$$

Where:
W = weight, (lbs) 241
ACF = acceleration factor 242
$\delta_T$ = pressure ratio, function of ALT 245
$\delta_T$ = total pressure ratio, function of ALT 245
$\gamma$ = flight path angle, (radians) 255
AvgWf = fuel flow data, (lbs/hour) 243
$\theta$ = temperature ratio, function of ALT 245
V = true airspeed, (knots) 244
$\sigma$ = density ratio, function of ALT 245
$\alpha$ = angle of attack = 3.0
BOW = Basic Operating Weight, Pilot entered value PAR 4 (lbs)
$\phi$ = Roll Angle = 0.0
J = Joule's Constant, 778 ft lb/BTU
Hf = heat value of fuel, approximately 18,400 BTU/lb
Perf Factor A = Aslope*ALTITUDE(245) + Aintercept
Perf Factor B = Bslope*ALTITUDE (245) + Bintercept
Perf Factor C = Cslope*ALTITUDE (245) + Cintercept After a predicted Flight Path Angle 256 is generated for a particular altitude segment 245, the Flight Path Angle 257 is applied to predicted Flight Plan 261 lateral curve path distances to predict Top of Climb (TOC) (distance/time to reach TOC), Top of Descent (TOD) (distance/time to reach TOD), altitudes at waypoints, vertical speeds at waypoints, and other data derived from airplane/engine performance related information for the aircraft in the Flight Plan 261.

If the computer containing the present invention is new in an aircraft or for some reason a learned data reasonability tests has failed, then default predicted flight path angles will be used to make performance predictions. The default flight path angles are selected based on altitude from knowledge previously obtained.

While there has been shown what is considered the preferred embodiment of the present invention, it will be manifest that many changes and modifications can be made therein without departing from the essential spirit and scope of the invention. It is intended, therefore, in the annexed claims to cover all such changes and modifications which fall within the true scope of the invention.

What is claimed is:

1. A method of determining aircraft/engine performance for a current flight, wherein predefined performance parameters define the performance characteristics of the aircraft/engine combination, said method comprising the steps of:
   (a) based on the performance parameters learned from flights prior to the current flight, predicting the performance of the aircraft/engine combination for predetermined conditions;
   (b) learning the performance parameters of the aircraft/engine combination during the current flight, using previously learned performance parameters, including climb, cruse, and descent phases of said current flight, said learning including;
      (i) modeling the aircraft/engine to a mathematical model which includes predefined performance parameters;
      (ii) filtering the output of the mathematical model such that the performance parameters mean and standard deviations provide a best curve fit for predetermined inputs to the mathematical model;
      (iii) extracting the newly generated performance parameters obtained from the filtering step; and
      (iv) curve fitting the performance parameters to altitude;
   (c) saving the altitude curve fit performance parameters of step (b, iv) in a storage element; and
   (d) repeating steps a-c, thereby iterating the method of determining aircraft/engine performance on a predetermined time period during the entire current flight.

2. A method of determining aircraft/engine performance according to claim 1, wherein the mathematical model comprises a drag/thrust model.

3. A method of determining aircraft/engine performance according to claim 1, wherein the step of filtering utilizes discrete square root filtering.

4. A method of determining aircraft/engine performance according to claim 1, wherein the step of extracting utilizes a Gaussian reduction/back substitution technique.

5. A method of aircraft/engine performance according to claim 1, wherein the step of curve fitting utilizes a linear regression curve fitting technique.

6. A method of determining aircraft/engine performance according to claim 5, wherein the linear regression curve fitting technique is a least square curve fitting technique.

7. A method of determining aircraft/engine performance according to claim 1, wherein the storage element utilized to save the altitude curve fit performance parameters of step (b, iv) comprises a non-volatile memory thereby providing updated performance parameters for future flights, said performance parameters being learned parameters corresponding to the aircraft/engine combination.

8. A method of determining aircraft/engine performance according to claim 2, wherein the step of filtering utilizes discrete square root filtering.

9. A method of determining aircraft/engine performance according to claim 8, wherein the step of extracting utilizes a Gaussian reduction/back substitution technique.

10. A method of determining aircraft/engine performance according to claim 9, wherein the step of curve fitting utilizes a linear regression curve fitting technique.

11. A method of determining aircraft/engine performance according to claim 10, wherein the linear regression curve fitting technique is a least squares curve fitting technique.

12. A method of determining aircraft/engine performance according to claim 12, wherein the storage element utilized to save the altitude curve fit performance parameters of step (b, iv) comprises a non-volatile memory thereby providing updated performance parameters for future flights, said performance parameters being learned parameters corresponding to the aircraft/engine combination.

13. A method of determining aircraft/engine performance according to claim 1, further comprising the steps of:
   before repeating the steps of (a) through (c), performing a reasonableness test on predetermined parameters generated by the learning step.

14. A method of determining aircraft/engine performance according to claim 1, further including the step of:
   if no previously learned parameters exist, initializing predetermined parameters in the storage element with predetermined values.

15. A method of determining aircraft/engine performance according to claim 1, further comprising the step of:
   before the step of learning, determining if all predetermined criteria has been met before proceeding to the learning step.

16. A method of determining aircraft/engine performance, wherein predefined performance parameters define the performance characteristics of the aircraft/engine combination, said method comprising the steps of:

a) if no previously calculated performance parameters are available, initializing predetermined parameters in a storage element with predetermined values;

b) utilizing the performance parameters from the storage element, predicting the performance of the aircraft/engine combination for the given flight;

c) determining if all predetermined criteria has been met;

d) learning the performance parameters of the aircraft/engine combination for a given flight plan, using performance parameters available in said storage element, said learning including;
   i) modeling the aircraft/engine to a mathematical model which includes predefined performance parameters;
   ii) filtering the output of the mathematical model such that the performance parameters mean and standard deviations provide a best curve fit for predetermined inputs to the mathematical model;
   iii) extracting the newly generated performance parameters obtained from the filtering step;
   iv) curve fitting the performance parameters to altitude;
   v) performing a reasonableness test on the newly generated performance parameters; and
   vi) saving the altitude curve fit performance parameters in a temporary storage;

e) repeating step (b) through (d) on a predetermined time interval during the entire given flight; and f) at the conclusion of the given flight, updating the performance parameters in the storage element with the performance parameter in the temporary storage thereby including the parameters learned from the given flight.

* * * * *